(12) United States Patent
Chen et al.

(10) Patent No.: US 12,737,059 B2
(45) Date of Patent: Sep. 15, 2026

(54) MOUSE DEVICE STRUCTURE

(71) Applicant: LITE-ON Technology Corporation, Taipei (TW)

(72) Inventors: Chi-Feng Chen, Taipei (TW); Chih-Lung Lo, Taipei (TW); Zhi-Yun Zhang, Taipei (TW)

(73) Assignee: LITE-ON Technology Corporation, Taipei (TW)

( * ) Notice: Subject to any disclaimer, the term of this patent is extended or adjusted under 35 U.S.C. 154(b) by 0 days.

(21) Appl. No.: 19/271,800

(22) Filed: Jul. 17, 2025

(65) Prior Publication Data

US 2026/0099219 A1 Apr. 9, 2026

Related U.S. Application Data

(60) Provisional application No. 63/705,041, filed on Oct. 9, 2024.

(30) Foreign Application Priority Data

Feb. 10, 2025 (CN) ........................ 202520204027.6

(51) Int. Cl.
*H05K 5/03* (2006.01)
*G06F 3/0354* (2013.01)
*H05K 5/02* (2006.01)

(52) U.S. Cl.
CPC ....... *G06F 3/03543* (2013.01); *H05K 5/0208* (2013.01); *H05K 5/03* (2013.01)

(58) Field of Classification Search
CPC ... G06F 3/03543; G06F 3/039; H05K 5/0208; H05K 5/03
See application file for complete search history.

(56) References Cited

U.S. PATENT DOCUMENTS 4,640,597 A * 2/1987 Okano .................. G03B 21/30 353/101
6,304,249 B1 * 10/2001 Derocher ............ G06F 3/03543 248/118.1

(Continued)

FOREIGN PATENT DOCUMENTS

CN 208922216 U 5/2019
CN 217279524 U 8/2022

OTHER PUBLICATIONS

Handbook of Machining and Metal Working Calculations, Ron A. Walsh (Year: 2001).*

*Primary Examiner* — Antonio Xavier

(57) ABSTRACT

A mouse device structure of the disclosure includes a mouse main body having a depressed groove in a top portion thereof, a compression spring element having one end disposed in the depressed groove, a rolling member disposed at another end of the compression spring element, and a slidable cover slidably disposed at the top portion of the mouse main body, wherein the rolling member abuts an inner surface of the slidable cover, the slidable cover includes a first positioning groove and a second positioning groove, the first positioning groove and the second positioning groove are located in a sliding path of the slidable cover. The mouse device structure is in a usage state when the rolling member is positioned in the first positioning groove, and the mouse device structure is in a storage state when the rolling member is positioned in the second positioning groove.

9 Claims, 6 Drawing Sheets

(56) References Cited

U.S. PATENT DOCUMENTS

| | | | | |
|---|---|---|---|---|
| 2005/0116934 | A1* | 6/2005 | Yin | G06F 3/03543<br>345/163 |
| 2008/0055251 | A1* | 3/2008 | Yen | G06F 3/03543<br>345/163 |
| 2008/0186277 | A1* | 8/2008 | Wang | G06F 3/03543<br>345/157 |
| 2013/0221817 | A1* | 8/2013 | Lee | G06F 3/03543<br>312/223.2 |
| 2014/0001935 | A1* | 1/2014 | Lee | G06F 3/03<br>312/294 |
| 2018/0229114 | A1* | 8/2018 | Wang | A63F 13/24 |

* cited by examiner

MOUSE DEVICE STRUCTURE

CROSS-REFERENCE TO RELATED APPLICATIONS

This non-provisional application claims priority under 35 U.S.C. § 119(a) on U.S. provisional application No. 63/705,041 filed on Oct. 9, 2024 and China Patent Application No. 2025202040276 filed on Feb. 10, 2025, the entire contents of which are hereby incorporated by reference.

BACKGROUND OF THE DISCLOSURE

Field of the Disclosure

The disclosure relates to the technical field of a mouse device, and more particularly to a mouse device structure.

Description of the Related Art

As the technology of computer devices develops, the improvement of the peripheral devices thereof also continues. Conventional mouse devices manufactured by a standard process include buttons configured to be clicked by fingers, a rolling wheel and a mouse main body configured to be held by a hand, and these components constitute a complete mouse device. However, many modern mouse devices are designed with wireless connectivity to eliminate the connecting cable, thereby realizing miniaturization and weight reduction. The mouse main body is also miniaturized, thereby further reducing the whole size of the mouse device and facilitating the transport and storage of the mouse device. Although the improvements in design have reduced the size of the mouse device, the quality of the experience of operating the mouse device has been degraded because the main body of such a mouse device is too small to be easily be held by the hand of a user.

BRIEF SUMMARY OF THE DISCLOSURE

The disclosure provides a mouse device structure capable of switching between a usage state and a storage state, thereby solving the problems of poor utilization in the portability and storage of the conventional mouse device.

The mouse device structure, in accordance with an exemplary embodiment of the disclosure, includes a mouse main body having a depressed groove in a top portion thereof, a compression spring element having one end disposed in the depressed groove, a rolling member disposed at another end of the compression spring element, and a slidable cover slidably disposed at the top portion of the mouse main body, wherein the rolling member abuts an inner surface of the slidable cover, the slidable cover includes a first positioning groove and a second positioning groove, the first positioning groove and the second positioning groove are located in a sliding path of the slidable cover.

In another exemplary embodiment, the rolling member includes a rolling wheel, a rolling shaft and a wheel base; the rolling shaft extends through two end surfaces of the rolling wheel; two ends of the rolling shaft are positioned on the wheel base; a bottom surface of the wheel base is positioned at the another end of the compression spring element; and a surface of the rolling wheel abuts the slidable cover.

In yet another exemplary embodiment, the rolling member includes a rolling ball base and a rolling ball, the rolling ball base has an accommodating groove, the rolling ball is disposed in the accommodating groove, a bottom surface of the rolling ball base is positioned at the another end of the compression spring element, and the rolling ball abuts the slidable cover.

In another exemplary embodiment, the slidable cover further includes a limiting hole formed on an inner surface of the sliding cover, the mouse main body includes a limiting post disposed on the top portion, and the limiting post is disposed in the limiting hole.

In yet another exemplary embodiment, the limiting hole extends parallel to an arrangement direction of the first positioning groove and the second positioning groove, and the limiting hole has a length equal to a distance between the first positioning groove and the second positioning groove.

In another exemplary embodiment, the limiting post includes a limiting block disposed at one end of the limiting post, and the limiting block has an outer diameter greater than a width of the limiting hole.

In yet another exemplary embodiment, the slidable cover has an outer frame portion, the mouse main body further has a main body portion, the top portion is disposed above the main body portion, a notch is formed between the top portion and the main body portion, and the outer frame portion is slidably engaged with the notch.

In another exemplary embodiment, the outer frame portion has a size the same as that of the notch.

In yet another exemplary embodiment, the outer frame portion has an opening, and the top portion includes at least one control region adjacent to the opening.

In another exemplary embodiment, the outer frame portion has an opening, and a distance between the first positioning groove and the opening is shorter than a distance between the second positioning groove and the opening.

In another exemplary embodiment, the mouse device structure is in a usage state when the rolling member is positioned in the first positioning groove, and the mouse device structure is in a storage state when the rolling member is positioned in the second positioning groove.

The design of the mouse device structure of the disclosure is such that the mouse main body and the slidable cover provide structures for the storage state and the usage state. When the mouse device structure is in the storage state, the slidable cover slides to engage with the mouse main body, whereby the slidable cover overlaps the mouse main body and the mouse device therefore has a reduced size for storage. When the mouse device structure is in the usage state, the slidable cover slides to move away from the mouse main body, whereby the slidable cover extends outward from the mouse main body and the outward-extending slidable cover therefore increases the size of the mouse device to improve the user experience.

A detailed description is given in the following embodiments with reference to the accompanying drawings.

BRIEF DESCRIPTION OF THE DRAWINGS

The disclosure can be more fully understood by reading the subsequent detailed description and examples with references to the accompanying drawings, wherein.

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
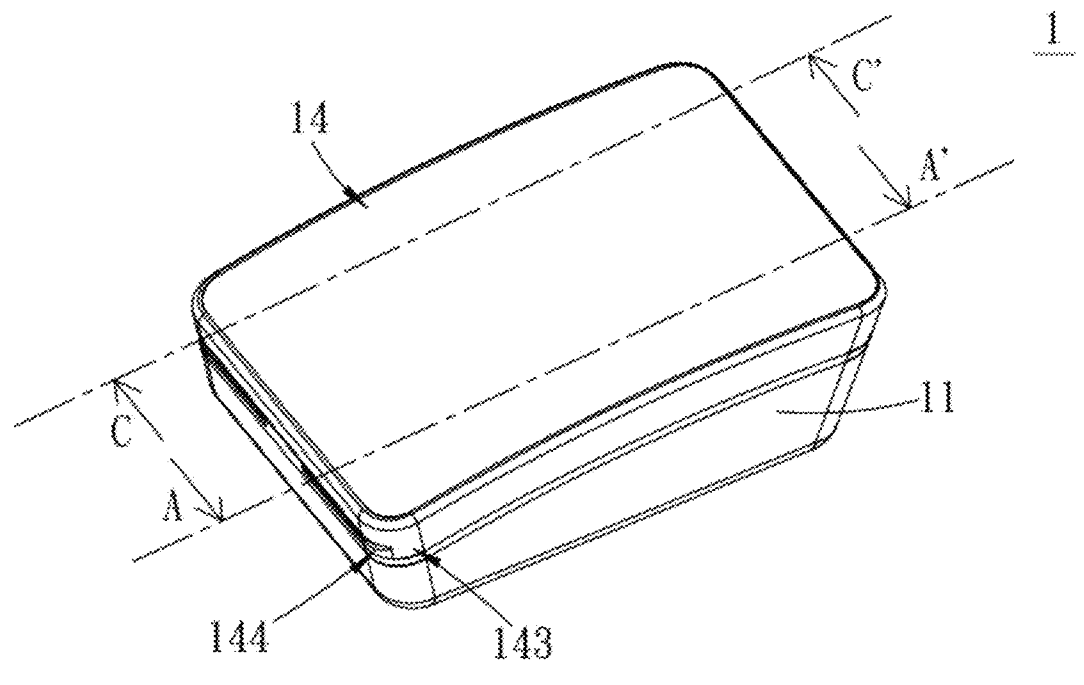
FIG. 1 is a perspective view of a mouse device structure of the disclosure in a storage state.
Figure 2:
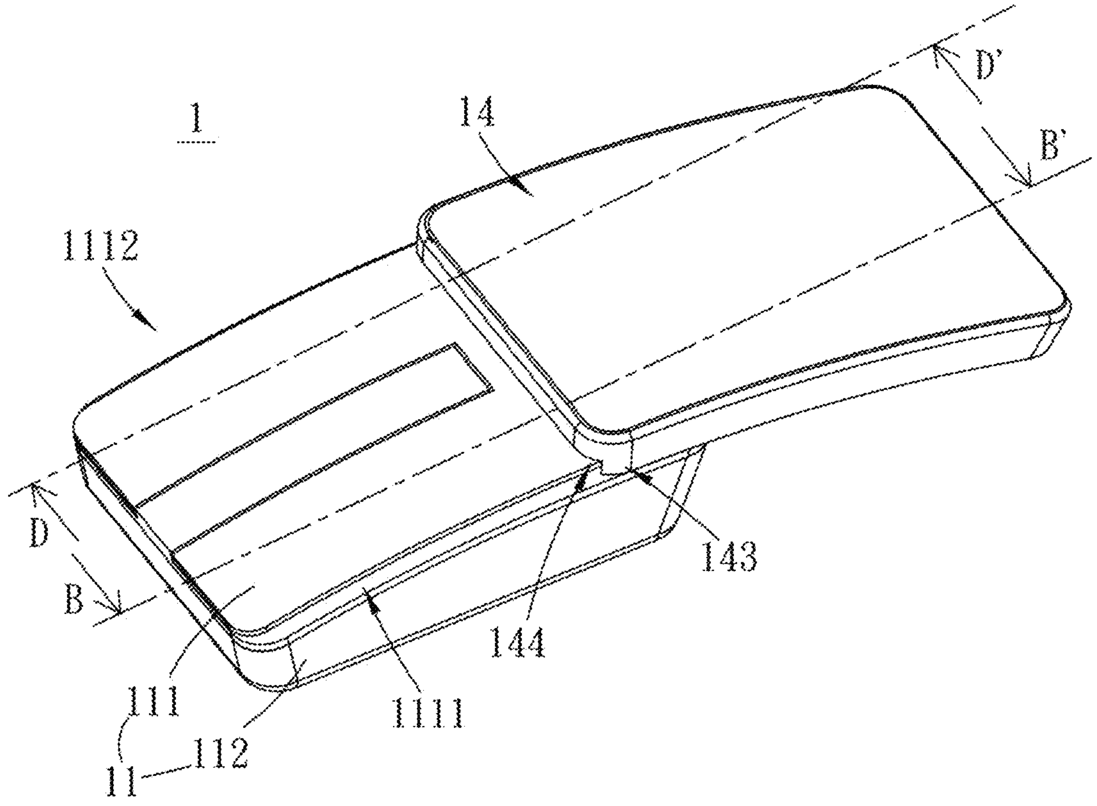
FIG. 2 is a perspective view of a mouse device structure of the disclosure in a usage state.
Figure 3:
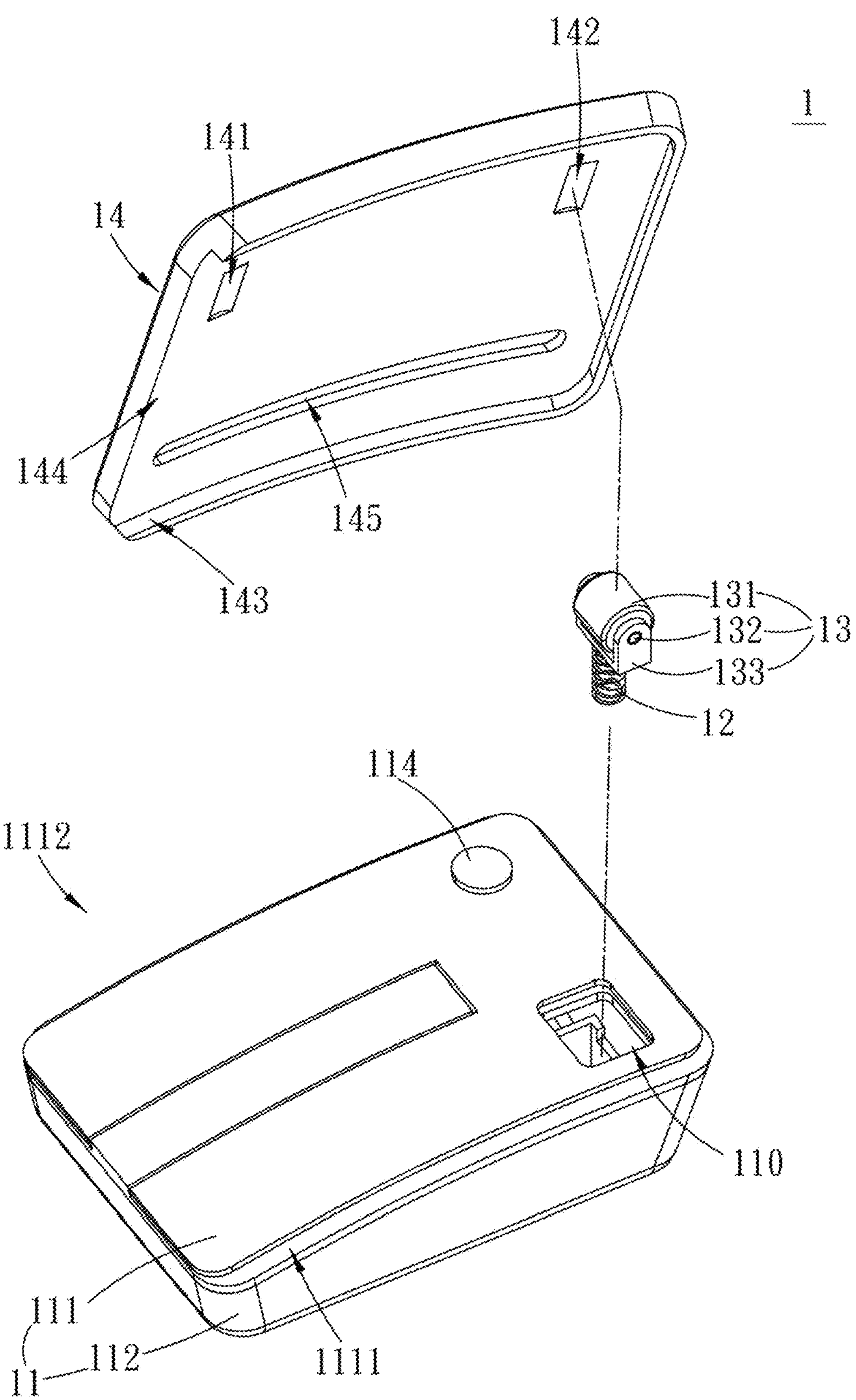
FIG. 3 is an exploded view of a first embodiment of a mouse device structure of the disclosure.

Referring to FIGS. 1, 2 and 3, a first embodiment of the mouse device structure of the disclosure is disclosed. The mouse device structure 1 of the first embodiment includes a mouse main body 11, a compression spring element 12, a rolling member 13 and a slidable cover 14. The mouse main body 11 has a depressed groove 110 on a top portion 111 thereof. One end of the compression spring element 12 is disposed in the depressed groove 110. The rolling member 13 is disposed at another end of the compression spring element 12. The slidable cover 14 is slidably disposed on the top portion 111 of the mouse main body 11. The rolling member 13 abuts an inner surface of the slidable cover 14. The slidable cover 14 includes a first positioning groove 141 and a second positioning groove 142 formed on the inner surface thereof. The first positioning groove 141 and the second positioning groove 142 are located in a sliding path of the slidable cover 14. The mouse device structure 1 is in a usage state when the rolling member 13 is positioned in the first positioning groove 141. The mouse device structure 1 is in a storage state when the rolling member 13 is positioned in the second positioning groove 142.

In the present embodiment, the slidable cover 14 includes an outer frame portion 143 disposed on a periphery thereof. The outer frame portion 143 has an opening 144 formed on one side thereof. A distance between the first positioning groove 141 and the opening 144 is shorter than a distance between the second positioning groove 142 and the opening 144. In other words, the first positioning groove 141 is located nearer to the opening 144 than the second positioning groove 142. The mouse main body 11 further includes a main body portion 112 above which the top portion 111 is disposed. A notch 1111 is formed between the top portion 111 and the main body portion 112; that is, the top portion 111 has an area smaller than that of the main body portion 112, whereby the notch 1111 is L-shaped and formed on a lateral surface of the top portion 111 and a top surface of the main body portion 112 is located near the top portion 111. The outer frame portion 143 of the slidable cover 14 is slidably engaged with the notch 1111, and the outer frame portion 143 has a size the same as that of the notch 1111. Therefore, when the mouse device structure 1 is in the storage state, the slidable cover 14 and the mouse main body 11 can overlap to form an integrated structure. Moreover, the top portion 111 includes at least one control region 1112 disposed at one side of the notch 1111. Mouse buttons or/and a rolling wheel are disposed in the control region 1112 as per design requirements.

Figure 4:
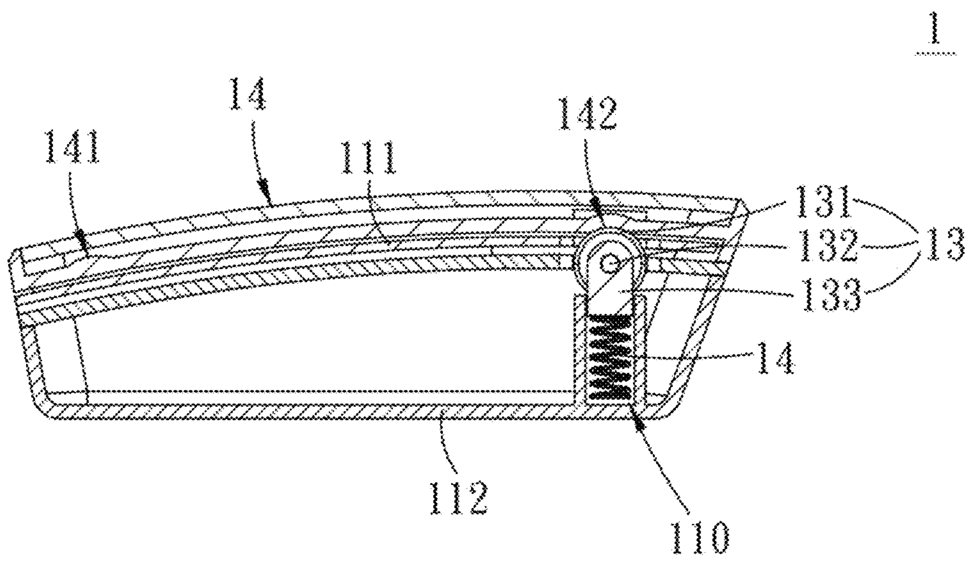
FIG. 4 is a cross-section of the first embodiment of the mouse device structure of the disclosure along a line A-A' of FIG. 1.
Figure 5:
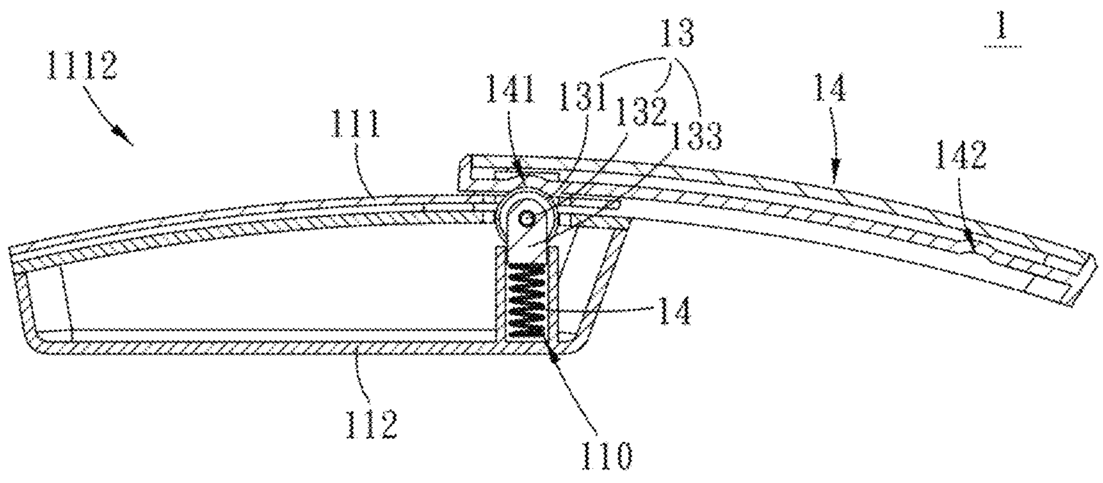
FIG. 5 is a cross-section of the first embodiment of the mouse device structure of the disclosure along a line B-B' of FIG. 2.

Referring to FIGS. 4 and 5, when the rolling member 13 is positioned in the first positioning groove 141, the slidable cover 14 slides to move away from the mouse main body 11, whereby the slidable cover 14 extends outward from the mouse main body 11. When the slidable cover 14 has moved outward to uncover the control region 1112, a user can operate the control region 1112. Thus, the mouse device structure 1 is in a usage state. When the rolling member 13 is positioned in the second positioning groove 142, the slidable cover 14 covers the mouse main body 11, whereby the slidable cover 14 is received in the mouse main body 11, and the slidable cover 14 covers the control region 1112. The covered control region 1112 is protected by the slidable cover 14 when the mouse device structure 1 is not in a usage state. In other words, the covered control region 1112 is protected by the slidable cover 14 when the mouse device structure 1 is in a storage state.

Referring to FIGS. 3, 4 and 5, the rolling member 13 includes a rolling wheel 131, a rolling shaft 132 and a wheel base 133. The rolling shaft 132 extends through two opposite end surfaces of the rolling wheel 131. The two end surfaces of the rolling wheel 131 are positioned in the wheel base 133. A bottom of the wheel base 133 is positioned at another end of the compression spring element 12. A curved surface of the rolling wheel 131 abuts the slidable cover 14. When the rolling wheel 131 of the rolling member 13 is engaged with the second positioning groove 142 (as shown in FIG. 4), the slidable cover 14 covers the mouse main body 11, and the rolling wheel 131 is pushed by the compression spring element 12 to abut the second positioning groove 142 of the slidable cover 14, whereby the slidable cover 14 and the mouse main body 11 are maintained in the storage state.

When the slidable cover 14 moves away from the mouse main body 11, the slidable cover 14 slides relative to the mouse main body 11, and the notch 1111 guides and limits the outer frame portion 143 of the slidable cover 14. The control region 1112 of the mouse main body 11 is gradually uncovered from the opening 144 of the slidable cover 14. The slidable cover 14 rotates the rolling wheel 131 with respect to the rolling shaft 132, whereby the rolling wheel 131 moves out of the second positioning groove 142. The slidable cover 14 begins to slide with the rolling wheel 131 abutting the inner surface of the slidable cover 14 until the rolling wheel 131 enters the first positioning groove 141. The rolling wheel 131 is pushed by the compression spring element 12 again to abut the first positioning groove 141, whereby the slidable cover 14 and the mouse main body 11 are maintained in an extended condition (the mouse device structure 1 is in a usage state). The first positioning groove 141 and the second positioning groove 142 are grooves having curved cross-sections, whereby the rolling wheel 131 can easily roll therein and also easily roll thereout.

Figure 6:
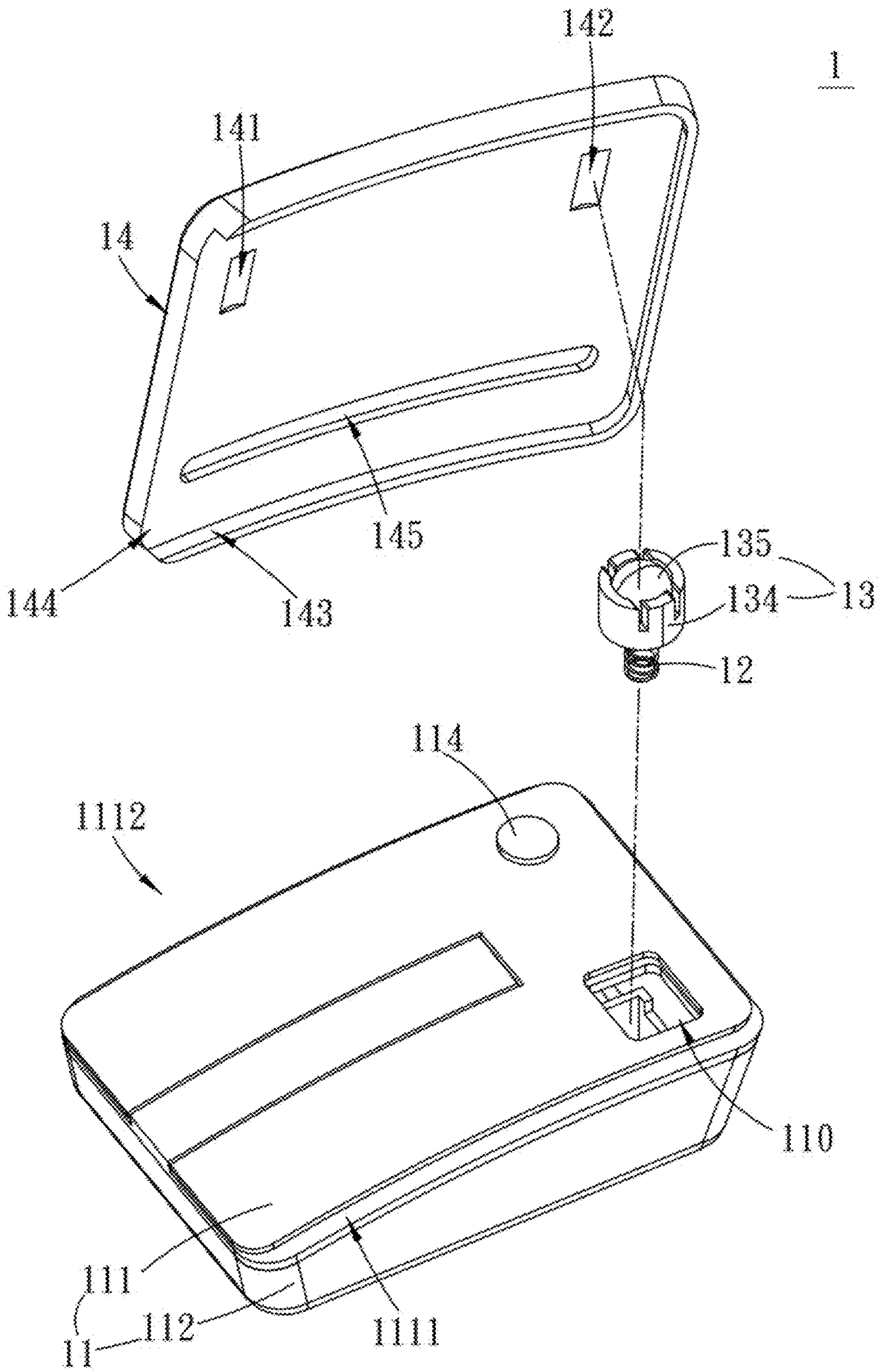
FIG. 6 is an exploded view of a second embodiment of a mouse device structure of the disclosure.
Figure 7:
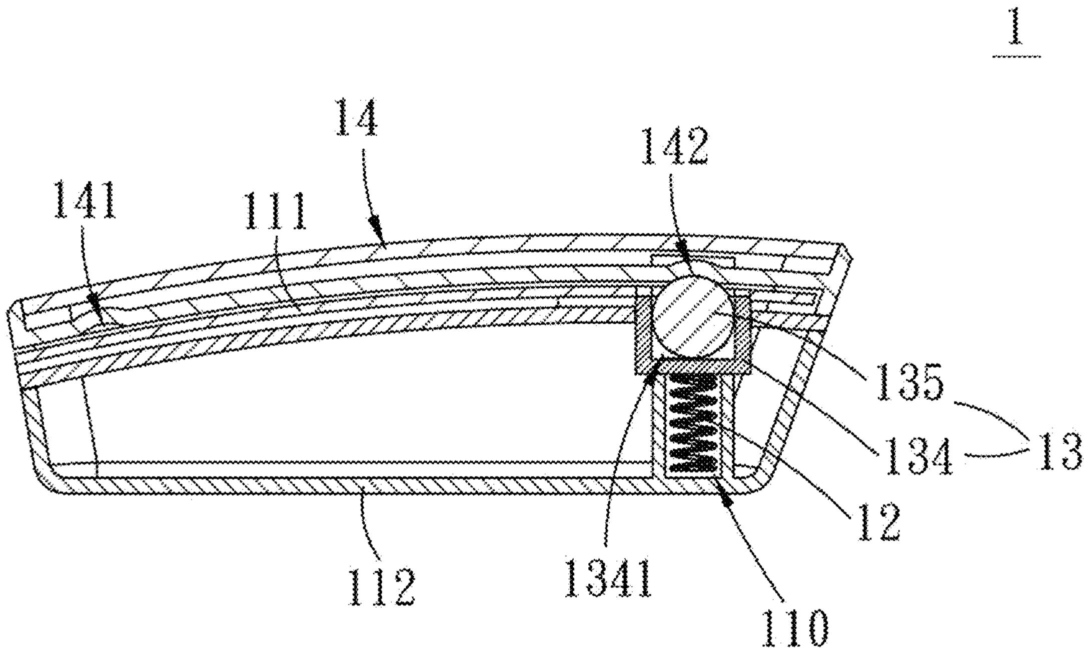
FIG. 7 is a cross-section of the second embodiment of the mouse device structure of the disclosure along a line A-A' of FIG. 1.
Figure 8:
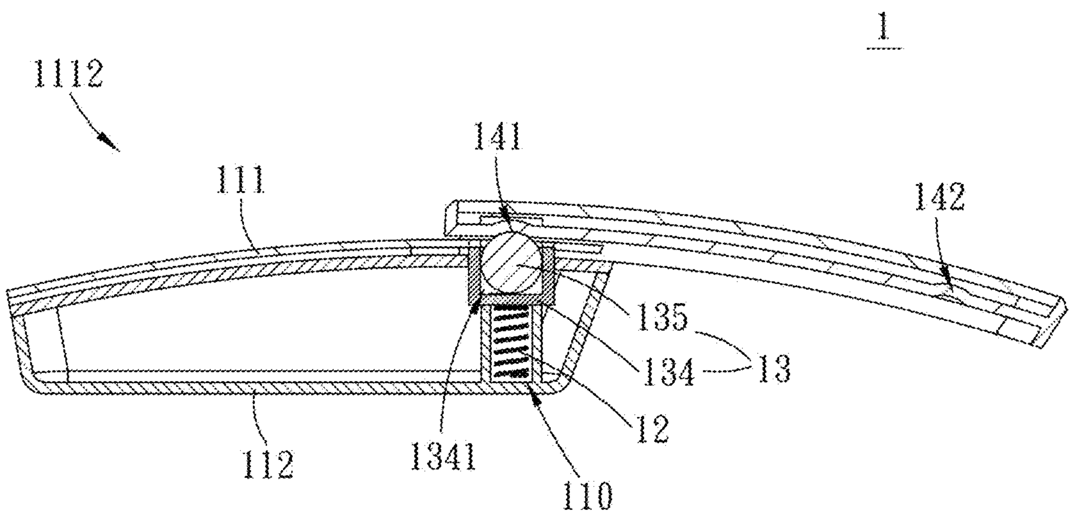
FIG. 8 is a cross-section of the second embodiment of the mouse device structure of the disclosure along a line B-B' of FIG. 2.

Referring to FIGS. 6, 7 and 8, a second embodiment of the mouse device structure of the disclosure is disclosed. The present embodiment differs from the first embodiment in the rolling member 13. The mouse device structure of the present embodiment has an appearance the same as that of the mouse device structure of the first embodiment (as shown in FIGS. 1 and 2). The rolling member 13 includes a rolling ball base 134 and a rolling ball 135. The rolling ball base 134 has an accommodating groove 1341 in which the rolling ball 135 is disposed. A bottom of the rolling ball base 134 is positioned at another end of the compression spring element 12, and a surface of the rolling ball 135 abuts the slidable cover 14. The rolling ball 135 can roll in any direction in the rolling ball base 134. Moreover, the rolling ball 135 provides the same technical effects as the rolling wheel 131 of the first embodiment, and the description of the technical effects is thus omitted.

Figure 9:
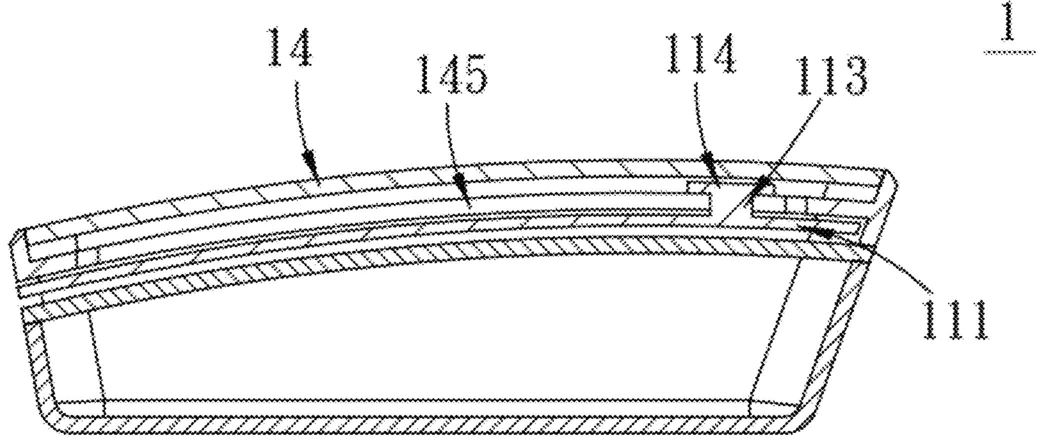
FIG. 9 is a cross-section of a limiting structure in a storage state along a line C-C' of FIG. 1.
Figure 10:
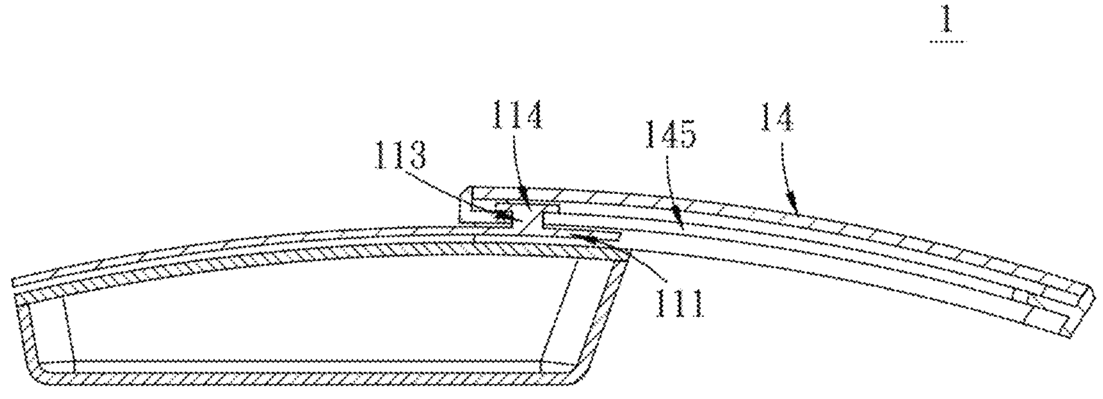
FIG. 10 is a cross-section of the limiting structure in a usage state along a line D-D' of FIG. 2.

Referring to FIGS. 3, 4, 5 and 6 as well as FIGS. 9 and 10, the slidable cover 14 of the present embodiment further includes a limiting hole 145 formed on an inner surface of the slidable cover 14. The mouse main body 11 has a limiting post 113 disposed on the top portion 111 thereof. The limiting post 113 is disposed in the limiting hole 145. The limiting hole 145 extends along a direction the same as the arrangement direction of the first positioning groove 141 and the second positioning groove 142, and the limiting hole 145 has a length equal to a distance between the first positioning groove 141 and the second positioning groove 142. The slidable cover 14 slides along the extending direction of the limiting hole 145. Therefore, the limiting post 113 limits the movement of the slidable cover 14 in a horizontal direction with respect to the mouse main body 11. The two opposite ends of the limiting hole 145 correspond to the positions of the first positioning groove 141 and the second positioning groove 142. When the slidable cover 14 slides such that the rolling member 13 is positioned in one of the first positioning groove 141 or the second positioning groove 142, positions of either two ends of the limiting hole 145 coincide with the limiting post 113. The combination of the limiting post 113 and the limiting hole 145 can also limit a sliding distance of the slidable cover 14 with respect to the mouse main body 11.

Moreover, the limiting post 113 further has a limiting block 114 disposed at one end of the limiting post 113. The limiting block 114 has an outer diameter greater than a width of the limiting hole 145. One end of the limiting post 113 extends through the limiting hole 145, and the limiting hole 145 has an accommodating space therein. When the limiting block 114 is positioned at one end of the limiting post 113, the limiting post 113 is limited by the limiting block 114 and the limiting hole 145 to maintain the limiting post 113 in the limiting hole 145. Therefore, the limiting bock 114 and the limiting hole 145 are capable of limiting the movement of the slidable cover 14 with respect to the mouse main body 11 in a vertical direction.

The rolling member 13 of the mouse main body 11 is complemented by the first positioning groove 141 and the second positioning groove 142. The rolling member 13 is positioned in the first positioning groove 141 of the slidable groove 14 when the mouse device structure 1 is in the usage state. The rolling member 13 is positioned in the second positioning groove 142 of the slidable groove 14 when the mouse device structure 1 is in the storage state. The rolling member 13 of the present embodiment is not limited. The rolling member 13 enables a smooth sliding movement of the slidable cover 14. In addition, as the slidable cover 14 and the mouse main body 11 are arranged in a simple sliding manner, the structure thereof is not complicated, and additional functionality can be designed into the structure. For example, when the mouse device structure 1 in the storage state, the rolling member 13 may be positioned in the second positioning groove 142, and the slidable cover 14 may slide to turn off the power supply of the mouse device structure 1. When the slidable cover 14 is in the extended condition (the mouse device structure 1 is in the usage state) with respect to the mouse main body 11, the rolling member 13 may be positioned in the first positioning groove 141, and the slidable cover 14 may slide to turn on the power supply of the mouse device structure 1. Such conditions may be designed according to the requirements of the users.

The design of the mouse device structure of the disclosure is such that the mouse main body and the slidable cover provide structures for the storage state and the usage state. When the mouse device structure is in the storage state, the slidable cover slides to engage with the mouse main body, whereby the slidable cover overlaps the mouse main body and the mouse device therefore has a reduced size for storage. When the mouse device structure is in the usage state, the slidable cover slides to move away from the mouse main body, whereby the slidable cover extends outward from the mouse main body and the outward-extending slidable cover therefore increases the size of the mouse device to improve the user experience.

While the disclosure has been described by way of example and in terms of preferred embodiments, it is to be understood that the disclosure is not limited thereto. On the contrary, the above description is intended to cover various modifications and similar arrangements (as would be apparent to those skilled in the art). Therefore, the scope of the appended claims should be accorded with the broadest interpretation so as to encompass all such modifications and similar arrangements.

What is claimed is:

1. A mouse device structure, comprising:

a mouse main body having a depressed groove in a top portion thereof; a compression spring element having one end disposed in the depressed groove;

a rolling member disposed at another end of the compression spring element; and a slidable cover slidably disposed at the top portion of the mouse main body, wherein the rolling member abuts an inner surface of the slidable cover, the slidable cover comprises a first positioning groove and a second positioning groove, the first positioning groove and the second positioning groove are located in a sliding path of the slidable cover, wherein the slidable cover further comprises a limiting hole formed on an inner surface of the slidable cover, the mouse main body comprises a limiting post disposed on the top portion, and the limiting post is disposed in the limiting hole.

2. The mouse device structure as claimed in claim 1, wherein the rolling member comprises a rolling wheel, a rolling shaft and a wheel base; the rolling shaft extends through two end surfaces of the rolling wheel; two ends of the rolling shaft are positioned on the wheel base; a bottom surface of the wheel base is positioned at the another end of the compression spring element; and a surface of the rolling wheel abuts the slidable cover.

3. The mouse device structure as claimed in claim 1, wherein the rolling member comprises a rolling ball base and a rolling ball, the rolling ball base has an accommodating groove, the rolling ball is disposed in the accommodating groove, a bottom surface of the rolling ball base is positioned at the another end of the compression spring element, and the rolling ball abuts the slidable cover.

4. The mouse device structure as claimed in claim 1, wherein the limiting hole extends parallel to an arrangement direction of the first positioning groove and the second positioning groove, and the limiting hole has a length equal to a distance between the first positioning groove and the second positioning groove.

5. The mouse device structure as claimed in claim 4, wherein the limiting post comprises a limiting block disposed at one end of the limiting post, and the limiting block has an outer diameter greater than a width of the limiting hole.

6. The mouse device structure as claimed in claim 1, wherein the slidable cover has an outer frame portion, the mouse main body further has a main body portion, the top portion is disposed above the main body portion, a notch is formed between the top portion and the main body portion, and the outer frame portion is slidably engaged with the notch.

7. The mouse device structure as claimed in claim 6, wherein the outer frame portion has an opening, and the top portion comprises at least one control region adjacent to the opening.

8. The mouse device structure as claimed in claim 6, wherein the outer frame portion has an opening, and a distance between the first positioning groove and the opening is shorter than a distance between the second positioning groove and the opening.

9. The mouse device structure as claimed in claim 1, wherein the mouse device structure is in a usage state when the rolling member is positioned in the first positioning groove, and the mouse device structure is in a storage state when the rolling member is positioned in the second positioning groove.

* * * * *